United States Patent
Sharma

(10) Patent No.: US 8,114,472 B2
(45) Date of Patent: Feb. 14, 2012

(54) METHOD OF MAKING A TEMPERABLE ANTIGLARE COATING, AND RESULTING PRODUCTS CONTAINING THE SAME

(75) Inventor: Pramod K. Sharma, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 931 days.

(21) Appl. No.: 12/007,251

(22) Filed: Jan. 8, 2008

(65) Prior Publication Data
US 2009/0176107 A1 Jul. 9, 2009

(51) Int. Cl.
*B05D 5/06* (2006.01)
*B05D 3/12* (2006.01)
*B05D 3/02* (2006.01)

(52) U.S. Cl. ..... 427/165; 427/168; 427/240; 427/372.2; 427/384

(58) Field of Classification Search .......... 427/240, 427/165, 168, 163.3, 372.2, 384
See application file for complete search history.

(56) References Cited

U.S. PATENT DOCUMENTS

| | | |
|---|---|---|
| 3,679,451 A | 7/1972 | Marks et al. |
| 3,697,277 A | 10/1972 | King |
| 4,168,332 A | 9/1979 | Leinen et al. |
| 4,510,344 A | 4/1985 | Berman |
| 4,792,536 A | 12/1988 | Pecoraro et al. |
| 4,806,436 A | 2/1989 | Tada et al. |
| 4,816,333 A | 3/1989 | Lange et al. |
| 4,830,879 A | 5/1989 | Debsikdar |
| 5,171,411 A | 12/1992 | Hillendahl et al. |
| 5,214,008 A | 5/1993 | Beckwith et al. |
| 5,326,519 A | 7/1994 | Claussen |
| 5,401,287 A | 3/1995 | Pecoraro et al. |
| 5,699,035 A | 12/1997 | Ito et al. |
| 5,750,203 A | 5/1998 | Chung |
| 5,883,030 A | 3/1999 | Bako et al. |
| 5,932,168 A * | 8/1999 | Su ................... 264/621 |
| 5,948,131 A | 9/1999 | Neuman |
| 5,964,962 A | 10/1999 | Sannomiya et al. |
| 5,977,477 A | 11/1999 | Shiozaki |
| 6,123,824 A | 9/2000 | Sano et al. |
| 6,187,824 B1 | 2/2001 | Swank |
| 6,288,325 B1 | 9/2001 | Jansen et al. |

(Continued)

FOREIGN PATENT DOCUMENTS

DE 34 03 378 8/1985

(Continued)

OTHER PUBLICATIONS

European Search Report dated Apr. 9, 2009.

(Continued)

*Primary Examiner* — James Lin
(74) *Attorney, Agent, or Firm* — Nixon & Vanderhye P.C.

(57) ABSTRACT

A method of making an antiglare coating using a mullite sol, possibly for use in a plasma display device, a photovoltaic device, or the like. The method may include the following steps in certain example embodiments: forming a mullite sol by mixing glycycloxypropyltrimethoxysilane (or other suitable silane) with an aluminum chloride (or other suitable aluminum-containing compound), and one or more of a solvent and water; casting the mixture by spin coating to form a layer on a substrate (e.g., a glass substrate); and curing and/or heat treating the layer. This layer may make up all or only part of an antiglare coating.

17 Claims, 2 Drawing Sheets

U.S. PATENT DOCUMENTS

| | | | |
|---|---|---|---|
| 6,372,327 B1 | 4/2002 | Burnham et al. | |
| 6,403,509 B2 | 6/2002 | Cochran et al. | |
| 6,407,021 B1 | 6/2002 | Kitayama et al. | |
| 6,469,438 B2 | 10/2002 | Fukuoka et al. | |
| 6,495,482 B1 | 12/2002 | de Sandro et al. | |
| 6,498,118 B1 | 12/2002 | Landa et al. | |
| 6,503,860 B1 | 1/2003 | Dickinson et al. | |
| 6,506,622 B1 | 1/2003 | Shiozaki | |
| 6,521,558 B2 | 2/2003 | Landa et al. | |
| 6,573,207 B2 | 6/2003 | Landa et al. | |
| 6,576,349 B2 | 6/2003 | Lingle et al. | |
| 6,597,525 B2 | 7/2003 | Kubota | |
| 6,610,622 B1 | 8/2003 | Landa et al. | |
| 6,613,603 B1 | 9/2003 | Sano | |
| 6,627,322 B2 | 9/2003 | Choi et al. | |
| 6,716,780 B2 | 4/2004 | Landa et al. | |
| 6,723,211 B2 | 4/2004 | Lingle et al. | |
| 6,749,941 B2 | 6/2004 | Lingle | |
| 6,776,007 B2 | 8/2004 | Hirota et al. | |
| 6,784,361 B2 | 8/2004 | Carlson et al. | |
| 6,787,005 B2 | 9/2004 | Laird et al. | |
| 6,796,146 B2 | 9/2004 | Burnham | |
| 6,844,210 B2 | 1/2005 | Fukuoka et al. | |
| 6,846,760 B2 | 1/2005 | Siebers et al. | |
| 6,887,575 B2 | 5/2005 | Neuman et al. | |
| 6,933,672 B2 | 8/2005 | Hosokawa | |
| 6,936,347 B2 | 8/2005 | Laird et al. | |
| 6,963,168 B2 | 11/2005 | Eida et al. | |
| 6,963,383 B2 | 11/2005 | Tokailin et al. | |
| 6,972,750 B2 | 12/2005 | Yu | |
| 6,979,414 B2 | 12/2005 | Hosokawa | |
| 6,987,547 B2 | 1/2006 | Yang et al. | |
| 6,989,280 B2 | 1/2006 | Ko | |
| 7,008,066 B2 | 3/2006 | Suga et al. | |
| 7,132,666 B2 | 11/2006 | Nakata et al. | |
| 7,153,579 B2 | 12/2006 | Kriltz et al. | |
| 7,166,352 B2 | 1/2007 | Watanabe et al. | |
| 2002/0090519 A1 | 7/2002 | Kursawe et al. | |
| 2004/0028918 A1 | 2/2004 | Becker et al. | |
| 2004/0058079 A1 | 3/2004 | Yamada et al. | |
| 2004/0121896 A1 | 6/2004 | Landa et al. | |
| 2004/0209056 A1* | 10/2004 | Oguri | 428/212 |
| 2004/0209757 A1 | 10/2004 | Landa et al. | |
| 2004/0248995 A1 | 12/2004 | Glaubitt et al. | |
| 2004/0258929 A1 | 12/2004 | Glaubitt et al. | |
| 2006/0019114 A1 | 1/2006 | Thies et al. | |
| 2006/0046078 A1* | 3/2006 | Richter et al. | 428/447 |
| 2006/0293163 A1* | 12/2006 | Landa et al. | 501/71 |
| 2008/0295884 A1* | 12/2008 | Sharma et al. | 136/256 |
| 2009/0148711 A1* | 6/2009 | Le Blanc et al. | 428/447 |

FOREIGN PATENT DOCUMENTS

| | | |
|---|---|---|
| EP | 0 374 754 | 6/1990 |
| EP | 1 099 962 | 5/2001 |
| FR | 2 886 309 * | 12/2006 |
| WO | WO 02/081397 | 10/2002 |
| WO | WO 2008/112047 | 9/2008 |

OTHER PUBLICATIONS

Sol-Gel AR Films for Solar Applications, Ashley et al., Mat Res. Soc. Symp. Proc. vol. 73, Sep. 1986.

"Sol-Gel AR Films for Metal Solar Mirrors", Reed et al., Mat. Res. So. Symp. Proc. vol. 121, Apr. 1988.

* cited by examiner

METHOD OF MAKING A TEMPERABLE ANTIGLARE COATING, AND RESULTING PRODUCTS CONTAINING THE SAME

Certain example embodiments of this invention relate to a composition and method of using an amorphous bimetallic oxide coating on a glass substrate. The coating may reduce reflected glare without affecting the quality of an image transmitted through the glass substrate. The coating may be tempered at a high temperature, such as, for example, 625° C. A suitable bimetallic oxide may be mullite, which may contain alumina and silica in a 3:1 molar ratio. The coating may be used as an antiglare coating on the incident side of the front substrate of a photovoltaic (PV) device or a display panel (e.g. plasma display panel) in certain example embodiments of this invention.

BACKGROUND AND SUMMARY OF EMBODIMENTS

In many applications, an image (or light generating a visual image) is projected through a transparent substrate (e.g., a glass substrate). In addition to the intended image, a viewer may see glare on that substrate. In certain embodiments, the present invention relates to reducing glare using a coating on the transparent substrate.

In some respects, glare may cause a loss in visual performance and visibility, annoyance and/or discomfort. These effects may be produced by a luminance in the visual field greater than the luminance to which the viewer's eyes are adapted.

The problems caused by glare from reflective surfaces such as glass (reflection glare) are well known. For example, incident light reflected from the glass surface of a television screen, video display terminal, cathode ray tubes (CRTs) and/or picture frames may reduce the visibility of the information or image being displayed. The glare may cause fatigue, eyestrain and/or headache for those who use or view the device for even a modest period of time. Cover glass for photographs, artwork and the like may also suffer from similar problem(s).

Many attempts to solve these problem(s) have been utilized in the past with varying degrees of success. One method of reducing reflection may involve etching the front glass with hydrofluoric acid to diffuse the reflected light. But the surface from etching may be highly nonuniform, which in turn may diffuse the transmittance nonuniformly. This nonuniformity may result in loss of contrast, for example, if the glass is a surface of CRT screen.

Another option may involve the use of a thin plastic filter. But those may easily damage and may not have sufficient durability.

Glare reducing coatings are known. See, e.g., U.S. Pat. Nos. 4,168,332 to Leinen et al.; 3,697,277 to King; 3,679,451 to Marks et al.; 6,597,525 to Kubota; 7,008,066 to Suga et al. But known coatings (or films) may be limited by their curing temperature due to the polymeric structure.

Thus, there may exist a need for a antiglare coating that does not degrade otherwise become affected during or after exposure to high temperatures, e.g., during tempering. In certain embodiments of the present invention, the coating may have a high strength of temperable glass.

In certain embodiments, the coating formulation may comprise an inorganic bimetallic system involving chelating and/or wetting agent(s). A suitable bimetallic oxide may be mullite, which contains alumina and silica in a 3:1 molar ratio.

Glass is desirable for numerous properties and applications, including optical clarity and overall visual appearance. For some example applications, certain optical properties (e.g., light transmission, reflection and/or absorption) are desired to be optimized. For example, in certain example instances, reduction of light reflection from the surface of a glass substrate may be desirable for storefront windows, display cases, photovoltaic devices such as solar cells, picture frames, other types of windows, and so forth.

Certain example embodiments of this invention relate, in part, to the formulation and manufacture of antiglare coatings produced using a sol-gel process, which are based on porous silica, for use in connection with glass intended to be used as a substrate in a number of different applications. These porous silica coatings may have high transmittance and a reduced amount of glare.

BRIEF SUMMARY OF EXAMPLE EMBODIMENTS OF THE INVENTION

In accordance with certain embodiments, there is a method of making an antiglare coating for use on a front surface of a display panel, the method comprising: forming a mixture of silica and alumina by mixing at least glycycloxypropyltrimethoxysilane with aluminum chloride, a solvent, water, a chelating agent, and a wetting agent; casting the mixture by spin coating to form a layer on a substrate; and curing and heat treating the layer, and using the layer in at least part of a plasma display panel or a liquid crystal display panel.

The coating may be used as an antiglare coating on the incident side of the front substrate of a photovoltaic (PV) device or a display panel (e.g. plasma display panel) in certain example embodiments of this invention.

In accordance with certain embodiments, the glass substrate comprises a soda-lime-silica glass including the following ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

In accordance with certain embodiments, there is a method of making an antiglare coating, the method comprising: forming a mixture of silica and alumina by mixing at least a silane with aluminum, a solvent, and water; casting the mixture by spin coating to form a layer on a glass substrate; and curing and heat treating the layer, the layer making up at least part of the antiglare coating.

In accordance with certain embodiments, the gloss of the antiglare coating at a gloss angle of 20° is less than the gloss of an uncoated glass substrate, and/or the gloss of the antiglare coating at a gloss angle of 60° is less than the gloss of an uncoated glass substrate.

In certain example embodiments, the antiglare coating is designed so as to permit thermal tempering of the glass substrate with the antiglare coating/layer thereon, where the antiglare coating/layer survives the tempering process without significant damage or degradation.

In accordance with certain embodiments, there is a plasma display panel comprising: a front glass; a rear glass; a reduced-pressure gas in the space between the front and rear glasses; and an antiglare coating on the viewer-side of the front glass; wherein antiglare coating comprises mullite.

In accordance with certain embodiments, there is a liquid crystal display panel comprising: a first polarizing plate; a second polarizing plate; a liquid crystal display cell between the first and second polarizing plates; a surface light source disposed on a side opposite a viewer; and an antiglare coating on the viewer-side of the first or second polarizing plate; wherein antiglare coating comprises mullite.

DETAILED DESCRIPTION OF EXEMPLARY EMBODIMENTS OF THE INVENTION

Figure 1:
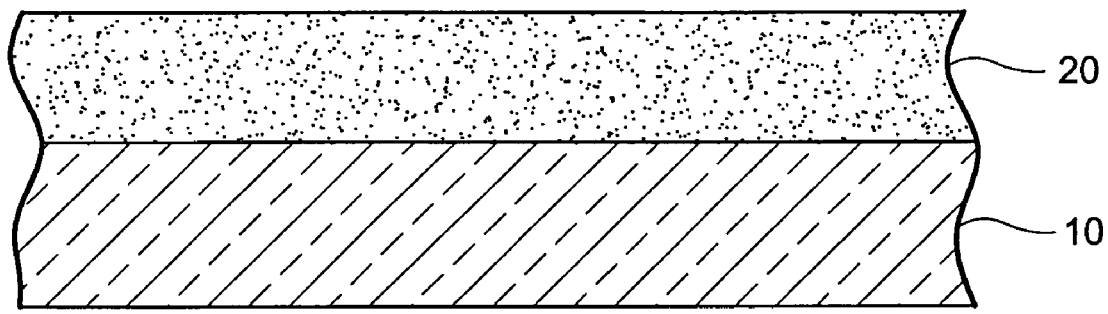
FIG. 1 schematically illustrates a glass substrate coated with an anti-glare coating in accordance with an embodiment of the present invention.

Referring now more particularly to the accompanying drawings in which like reference numerals indicate like parts throughout the several views.

FIG. 1 is a side-view schematically illustrating a substrate 10 having an antiglare coating 20 on the substrate 10. The substrate may comprise glass, plastic, or any other suitable material permitting transmission of light therethrough. It may be incorporated into any suitable application, including, for example, photovoltaic devices, storefront windows, display cases, picture frames, other types of windows, greenhouses, televisions (e.g., cathode ray tubes, projection televisions, plasma display panels, liquid crystal displays, etc.), other display devices, and the like.

Figure 2:
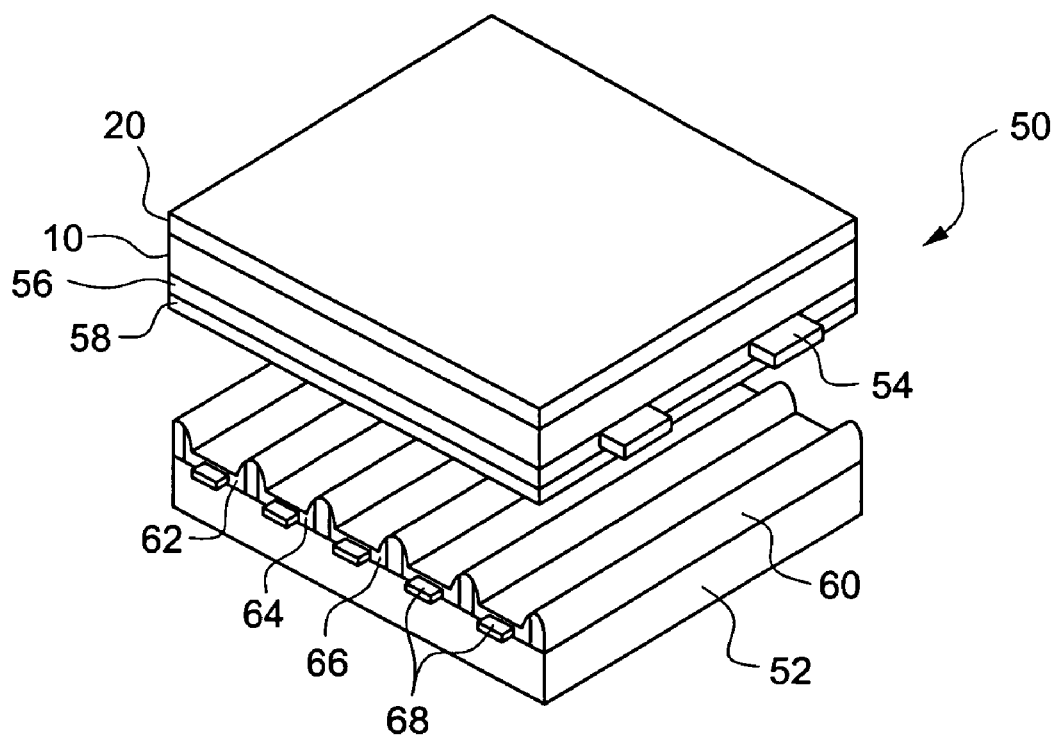
FIG. 2 schematically illustrates an expanded view of a plasma display panel in accordance with an embodiment of the present invention.

FIG. 2 is an expanded view illustrating the structure of an exemplary plasma display panel (PDP). In this figure, PDP 50 has a construction in which a front glass 10 and a rear glass 52 are disposed to face each other, and in the space between the two glasses 10 and 52, a gas, such as xenon, is sealed in a reduced pressure state. On the front glass 10, discharge electrodes 54, a dielectric film 56, a protecting film 58, etc. are formed, and on the rear glass 52, a partition wall 60, phosphors 62, 64, 66, address electrodes 68, etc. are provided.

The front glass 10 of PDP 50 supports at least antiglare coating 20. Of course, PDP 50 is provided for the purposes of schematic illustration only, and other suitable configurations for PDPs are contemplated, so long as the PDP includes a substrate (like front glass 10) and an antiglare coating 20 on the substrate.

Figure 3:
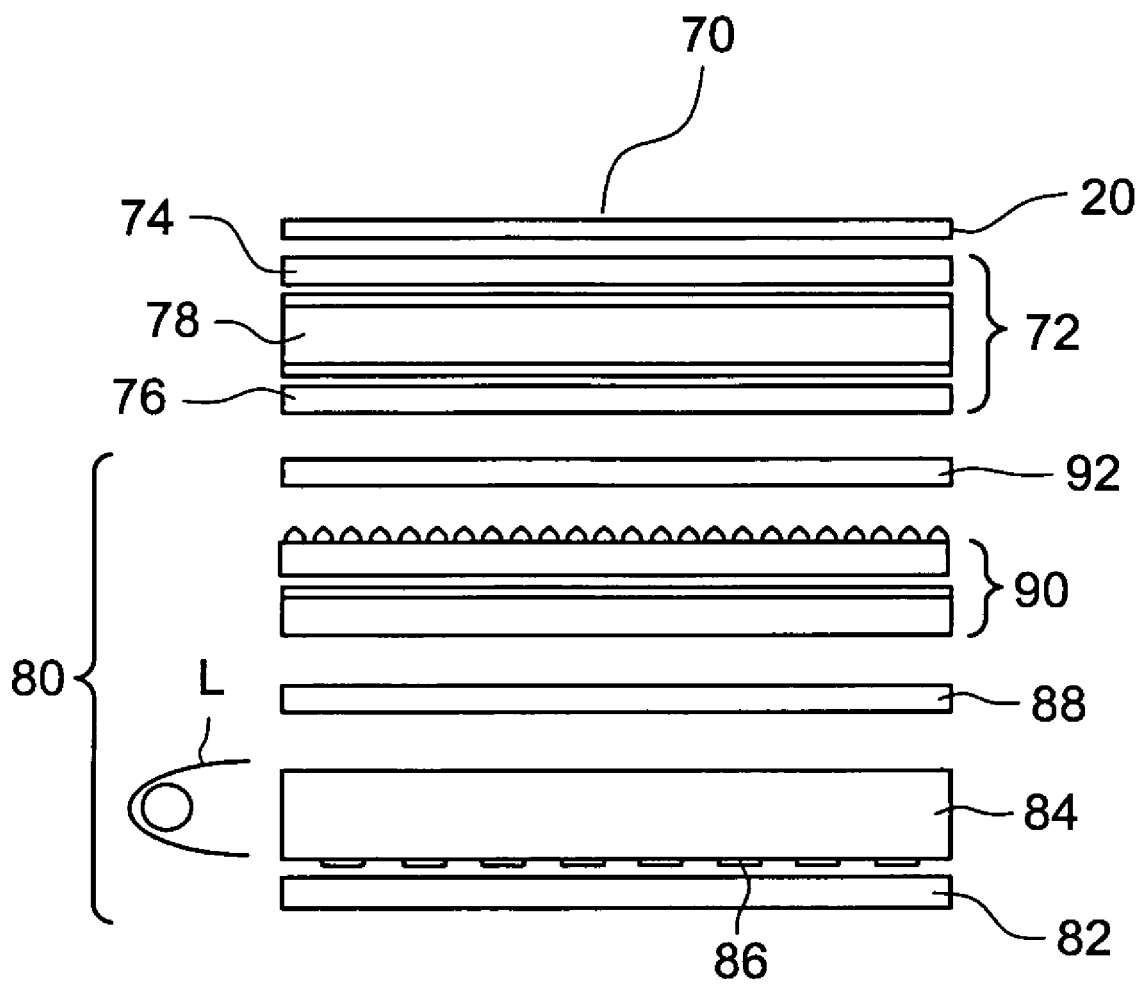
FIG. 3 schematically illustrates an expanded view of a liquid crystal display panel in accordance with an embodiment of the present invention.

FIG. 3 is an expanded view illustrating the structure of an exemplary liquid crystal display (LCD) device 70. The LCD 70 has a liquid crystal panel 72 including two polarizing plates 74 and 76 and a liquid crystal display cell 78 sandwiched between the two polarizing plates 74 and 76. LCD 70 also includes a surface light source device 80 disposed on the side opposite the viewer.

The surface light source device 80 comprises, for example, a reflector plate 82, a light guide plate 84 having a dot pattern 86 on its underside, a light diffusive film 88, a lens sheet 90, and a protective film 92 provided in that order from the lower side. Also included in LCD 70 is antiglare coating 20, which may rest on substrate 10 (not shown) or on polarizing plate 74.

This invention may also relate to antiglare coatings that may be provided for in coated articles used in devices such as photovoltaic devices, storefront windows, display cases, picture frames, other types of windows, and the like.

In certain example embodiments of this invention, high transmission low-iron glass may be used for substrate 10 in order to further increase the transmission of radiation (e.g., photons) to the active layer of the solar cell or the like. For example and without limitation, the glass substrate 10 may be of any of the glasses described in any of U.S. patent application Ser. Nos. 11/049,292 and/or 11/122,218, the disclosures of which are hereby incorporated herein by reference. Furthermore, additional suitable glasses include, for example (i.e., and without limitation): standard clear glass; and/or low-iron glass, such as Guardian's ExtraClear, UltraWhite, or Solar. No matter the composition of the glass substrate, certain embodiments of anti-reflective coatings produced in accordance with the present invention may increase transmission of light to the active semiconductor film of the photovoltaic device.

Certain glasses for substrate 10 (which or may not be patterned in different instances) according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients: $SiO_2$, 67-75% by weight; $Na_2O$, 1-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO, by weight.

In addition to the base glass above, in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium, erbium and/or the like). In certain example embodiments of this invention, the resulting glass has visible transmission of at least 75%, more preferably at least 80%, even more preferably of at least 85%, and most preferably of at least about 90% (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table I below (in terms of weight percentage of the total glass composition):

TABLE 1

| Example Additional Materials In Glass | | | |
|---|---|---|---|
| Ingredient | General (Wt. %) | More Preferred | Most Preferred |
| total iron (expressed as $Fe_2O_3$): | 0.001-0.06% | 0.005-0.04% | 0.01-0.03% |
| cerium oxide: | 0-0.30% | 0.01-0.12% | 0.01-0.07% |
| $TiO_2$ | 0-1.0% | 0.005-0.1% | 0.01-0.04% |
| Erbium oxide: | 0.05 to 0.5% | 0.1 to 0.5% | 0.1 to 0.35% |

In certain example embodiments, the total iron content of the glass is more preferably from 0.01 to 0.06%, more preferably from 0.01 to 0.04%, and most preferably from 0.01 to 0.03%. In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. However, in certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

It is noted that the light-incident surface of the substrate 10 may be flat or patterned in different example embodiments of this invention.

While certain of the antiglare coatings 20 discussed above are used in the context of PDPs, LCDs, and the like, this invention is not so limited. Antiglare coatings according to this invention may be used in other applications, such as, for example, photovoltaic devices/modules, picture frames, fireplace doors, and the like. Also, other layer(s) may be provided on the substrate under the antiglare coating so that the antiglare coating is considered on the substrate even if other layers are provided therebetween. For example, while the antiglare coating 20 is directly on and contacting the substrate 10 in the embodiment depicted in FIG. 1, it is possible to provide other layer(s) between the substrate and the antiglare layer in alternative embodiments of this invention.

Exemplary embodiments of this invention provide a new method to produce antiglare coating 20, with appropriate light transmission properties. In certain example embodiments of this invention, the coating solution may be partially based on a polymeric solution including or consisting essentially of silica chains. It may be possible to also incorporate a colloidal silica solution including or consisting essentially of particulate silica in a solvent.

In making a mullite sol, a silane may be mixed with an aluminum-containing compound, such as aluminum chloride. Suitable silanes may include, for example, glycycloxypropyltrimethoxysilane (glymo); tetraethoxysilane (TEOS); 3-aminopropyl triethoxysilane; phenyltriethoxysilane; allyltrimethoxysilane; and 3-cyanopropyl triethoxysilane. Other silanes, including those listed above, may include a methoxy group in place of an ethoxy group. Suitable aluminum-containing compounds include, for example, aluminum nitrate, aluminum isopropoxide, aluminum iso butoxide, and aluminum acetate.

The silane and aluminum may be mixed with a solvent and/or water and agitated. Suitable solvents may include, for example, n-propanol, isopropanol, other well-known alcohols (e.g., ethanol), and other well-known organic solvents (e.g., toluene). Before or after agitating, the solution may be further mixed with a chelating agent (such as ethylacetoacetate, available from Aldrich) and/or a wetting agent (such as a nonionic surfactant, like Triton X-100, available from the Aldrich). Preferably, the alumina and silica in the resulting solution should be in a 3:2 molar ratio, such that $3Al_2O_3$: $2SiO_2$.

The sol coating solution may then be deposited on a suitable substrate, such as a highly transmissive clear glass substrate. Any suitable deposition method may be used, including, for example, flow coating, spin coating, roller coating, spray coating, sputter deposition, etc.

Then, the sol gel coating solution on the substrate is heated, cured, and/or fired, thereby forming the solid antiglare coating 20 on the substrate 10. The curing may occur at a temperature between 100 and 150° C. for up to 2 minutes, and the heat treating may occur at a temperature between 600 and 750° C. for up to 5 minutes. Shorter and longer times with higher and lower temperatures are contemplated within exemplary embodiments of the present invention.

The final thickness of the antiglare coating 20 may vary in certain example embodiments of this invention.

Several examples were prepared in accordance with non-limiting, exemplary embodiments.

Example #1

Aluminum chloride dehydrated (5.6 gm) and 1.9 gm of glycycloxylpropyltrimethoxysilane (glymo) (available from Gelest, Inc.) were mixed together with 21.4 gm of ethanol and stirred for 6 hours. The aluminum chloride was completely dissolved in the solution. To this solution, 6 gm of ethylacetoacetate (available from Aldrich), 1.87 gm of Triton X-100 (available from Aldrich), and 2.52 gm of water was added. The ethylacetoacetate was used as a chelating agent and Triton X-100 was used as a wetting agent to the coating solution. This solution was mixed for another 1 hour. Aluminum chloride and glycycloxylpropyltrimethoxysilane (glymo) are precursors of $Al_2O_3$ and $SiO_2$ respectively.

The amount of precursor selected should be based on $3Al_2O_3:2SiO_2$, which is a composition of mullite. Hence, this solution is called a "mullite sol."

The mullite coating was fabricated using spin coating method with 1000 rpm for 18 secs. The coating was heated on hot plate for 5 minutes and then tempered in the belt furnace at 625° C. for three and a half minutes. The gloss of the tempered coating was measured by Gloss reflectometer 4600 from BYK Gardner at 20° and 60°. Specular reflection and transmission at the film side was measured using US XE-P/N A60-1005 from Hunter Scan. Table 2 indicates the gloss, reflection and transmission at the film side.

Example #2

Example #2 is similar to Example #1, except the coating was fabricated using 1200 rpm for 18 seconds. The coating was cured and tempered exactly similar to Example #1. Table 2 indicates the gloss, reflection and transmission at the film side.

Example #3

Example #3 is similar to Example #1, except the coating was fabricated using 1500 rpm for 18 seconds. The coating was cured and tempered exactly similar to Example #1. Table 2 indicates the gloss, reflection and transmission at the film side.

Example #4

Example #4 is similar to Example #1, except the coating was fabricated using 1800 rpm for 18 seconds. The coating was cured and tempered exactly similar to Example #1. Table 2 indicates the gloss, reflection and transmission at the film side.

Example #5

Example #5 is similar to Example #1, except the coating was fabricated using 2000 rpm for 18 seconds. The coating was cured and tempered exactly similar to Example #1. Table 2 indicates the gloss, reflection and transmission at the film side.

Example #6

Example #6 is similar to Example #1, except the coating was fabricated using 2500 rpm for 18 seconds. The coating was cured and tempered exactly similar to Example #1. Table 2 indicates the gloss, reflection and transmission at the film side.

Example #7

Example #7 is similar to Example #1, except the coating was fabricated using 2700 rpm for 18 seconds. The coating was cured and tempered exactly similar to Example #1. Table 2 indicates the gloss, reflection and transmission at the film side.

Example #8

Example #8 is similar to Example #1, except the coating was fabricated using 3000 rpm for 18 seconds. The coating was cured and tempered exactly similar to Example #1. Table 2 indicates the gloss, reflection and transmission at the film side.

TABLE 2

Optical properties of exemplary antiglare coatings

| Examples | Gloss 20° | Gloss 60° | % $R_{Film\ side}$ | % $T_{Film\ side}$ |
|---|---|---|---|---|
| Uncoated glass | 169 | 161 | 34.4 | 90.2 |
| Example#1 | 85.9 | 98.4 | 10.89 | 84.09 |
| Example#2 | 75.3 | 84.1 | 10.74 | 84.5 |
| Example#3 | 69.8 | 81.4 | 10.64 | 84.5 |
| Example#4 | 70.6 | 82.8 | 10.55 | 85.08 |
| Example#5 | 66 | 76.2 | 10.5 | 85.12 |
| Example#6 | 39.7 | 45.4 | 10.46 | 85.76 |
| Example#7 | 28.3 | 29.8 | 10.39 | 86.73 |

In accordance with at least certain embodiments, gloss can be reduced from 169 to 23 (i.e., 86%) at gloss angle of 20° and from 161 to 30 (i.e., 81.3%) at gloss angle of 60°; specular reflection of the coating can be reduced by 69.8%; and transmission of the antiglare coating that can be achieved is 84-87%. The antiglare properties may exist only achieved when the coatings are tempered. In at least certain embodiments, the antiglare coating is stable at high temperature at 650° C.

All described and claimed numerical values and ranges are approximate and include at least some degree of variation.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making an antiglare coating for use on a front surface of a display panel or photovoltaic device, the method comprising:
    forming a mixture comprising silica and alumina by mixing at least glycycloxypropyltrimethoxysilane with aluminum chloride, a solvent, water, a chelating agent, and a wetting agent;
    casting the mixture by spin coating to form a layer on a substrate; and
    curing and heat treating the layer, and using the layer in at least part of a display panel or photovoltaic device.

2. The method of claim 1, wherein the substrate comprises glass, and wherein the mixture consists essentially of silica, alumina, solvent, water, the chelating agent and the wetting agent.

3. The method of claim 2, wherein the glass substrate comprises a soda-lime-silica glass including the following ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

4. The method of claim 1, wherein the solvent comprises ethanol.

5. The method of claim 1, wherein the chelating agent comprises ethylacetoacetate.

6. The method of claim 1, wherein the wetting agent comprises a nonionic surfactant.

7. The method of claim 1, wherein the step of casting occurs at least at 1000 rpm.

8. The method of claim 1, further comprising thermally tempering the glass substrate with the layer thereon, where the layer survives the tempering process without significant damage or degradation.

9. A method of making an antiglare coating, the method comprising:
    forming a mixture of silica and alumina by mixing at least a silane with aluminum, a solvent, and water, wherein the aluminum comprises aluminum chloride;
    casting the mixture by spin coating to form a layer on a glass substrate; and
    curing and heat treating the layer, the layer making up at least part of the antiglare coating.

10. The method of claim 9, wherein the glass substrate comprises a soda-lime-silica glass including the following ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

11. The method of claim 9, wherein the mixture further comprises a wetting agent comprising a nonionic surfactant.

12. The method of claim 9, wherein a gloss of the antiglare coating at a gloss angle of 20° is less than a gloss of an uncoated glass substrate.

13. The method of claim 9, wherein a gloss of the antiglare coating at a gloss angle of 60° is less than a gloss of an uncoated glass substrate.

14. The method of claim 9, further comprising thermally tempering the glass substrate with the layer thereon, where the layer survives the tempering process without significant damage or degradation.

15. A method of making an antiglare coating, the method comprising:
   forming a mixture comprising silica and alumina by mixing at least a silane with aluminum, a solvent, and water;
   casting the mixture by spin coating in forming a layer supported by a glass substrate;
   curing and heat treating the layer, the layer making up at least part of the antiglare coating; and
   wherein the silane comprises glycycloxypropyltrimethoxysilane.

16. The method of claim 15, wherein the aluminum comprises aluminum chloride.

17. A method of making an antiglare coating, the method comprising:
   forming a mixture comprising silica and alumina by mixing at least a silane with aluminum, a solvent, and water;
   casting the mixture by spin coating in forming a layer supported by a glass substrate;
   curing and heat treating the layer, the layer making up at least part of the antiglare coating; and
   wherein the mixture further comprises a chelating agent comprising ethylacetoacetate.

* * * * *